(12) United States Patent
Haba et al.

(10) Patent No.: US 7,737,513 B2
(45) Date of Patent: Jun. 15, 2010

(54) CHIP ASSEMBLY INCLUDING PACKAGE ELEMENT AND INTEGRATED CIRCUIT CHIP

(75) Inventors: Belgacem Haba, Saratoga, CA (US); Charles White, Los Altos, CA (US); Michael J. Nystrom, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 81 days.

(21) Appl. No.: 11/809,213

(22) Filed: May 30, 2007

(65) Prior Publication Data
US 2008/0296709 A1 Dec. 4, 2008

(51) Int. Cl.
*H01L 29/84* (2006.01)
*H01L 21/58* (2006.01)

(52) U.S. Cl. ............................. 257/416; 257/E29.324; 257/E21.505; 257/737; 257/738; 257/698; 257/734; 257/772; 257/782

(58) Field of Classification Search ................. 257/416, 257/E29.324, E21.505, 737, 738, 698, 734, 257/772, 782
See application file for complete search history.

(56) References Cited

U.S. PATENT DOCUMENTS

| | | | |
|---|---|---|---|
| 6,566,170 B1 | 5/2003 | Marion et al. | |
| 6,605,828 B1 | 8/2003 | Schwarzrock et al. | |
| 6,646,289 B1 | 11/2003 | Badehi et al. | |
| 6,661,084 B1 | 12/2003 | Peterson et al. | |
| 6,777,767 B2 | 8/2004 | Badehi et al. | |
| 2002/0000649 A1 | 1/2002 | Tilmans et al. | |
| 2002/0160583 A1 | 10/2002 | Song | |
| 2004/0188782 A1 | 9/2004 | Fujii | |
| 2008/0311704 A1* | 12/2008 | Oberle | 438/119 |

FOREIGN PATENT DOCUMENTS

EP 1513100 A1 * 3/2005
JP 2006-747750 * 3/2006

* cited by examiner

*Primary Examiner*—Alexander O Williams
(74) *Attorney, Agent, or Firm*—Lerner, David, Littenberg, Krumholz & Mentlik, LLP (57) ABSTRACT

The present invention provides an integrated circuit chip assembly and a method of manufacturing the same. The assembly includes a package element having a top surface and an integrated circuit chip having a top surface, a bottom surface, edge surface between the top and bottom surfaces, and contacts exposed at the top surface. The package element is disposed below the chip with the top surface of the package element facing toward the bottom surface of the chip. At least one spacer element resides between the top surface of the package element and the bottom surface of the chip. According to one embodiment, the at least one spacer element may form a substantially closed cavity between the package element and the integrated circuit chip. According to another embodiment, first conductive features may extend from the contacts of the chip along the top surface, and at least some of said first conductive features extend along at least one of the edge surfaces of the chip.

19 Claims, 6 Drawing Sheets

CHIP ASSEMBLY INCLUDING PACKAGE ELEMENT AND INTEGRATED CIRCUIT CHIP

BACKGROUND

Packaging of an integrated circuit chip involves mechanical and environmental protection of the chip. Packaging further involves electrical interconnection between contacts on the chip and external electrical terminals. For example, disclosed in U.S. Pat. No. 6,777,767, which is herein incorporated by reference, is a package element separated from an integrated circuit chip by a spacer element, thereby forming a cavity. However, a top surface of the chip having the contacts of the chip faces towards the package element and the cavity. Because contacts are on the top surface of the chip, leads extend from the conductive pads around edge and bottom surfaces of the chip in order to interconnect with other entities. Despite considerable effort in the art heretofore, still further improvements would be desirable.

SUMMARY

One aspect of the invention provides an assembly, comprising a package element having a top surface and an integrated circuit chip having a top surface, a bottom surface, and contacts exposed at the top surface. The package element is preferably disposed below the chip with the top surface of the package element facing toward the bottom surface of the chip. At least one spacer element may reside between the top surface of the package element and the bottom surface of the chip, the at least one spacer element typically forming a substantially closed cavity between the package element and the integrated circuit chip.

Another aspect of the invention provides an assembly, comprising a package element having a top surface and an integrated circuit chip having a top surface, a bottom surface, and usually edge surfaces extending between the top and bottom surfaces. Contacts of the chip may be exposed at the top surface. The package element may be disposed below the chip with the top surface of the package element facing toward the bottom surface of the chip. At least one spacer element may reside between the top surface of the package element and the bottom surface of the chip, the at least one spacer element generally forming a cavity between the package element and the integrated circuit chip. First conductive features may extend from the contacts of the chip along the top surface, and at least some of said first conductive features preferably extend along at least one of the edge surfaces of the chip.

An assembly according to yet another aspect of the invention includes a package element having a top surface and an integrated circuit chip having at least one top surface, a bottom surface, contacts exposed at a top surface, and at least one via extending through the chip from a top surface to the bottom surface. The package element may be disposed below the chip with the top surface of the package element facing toward the bottom surface of the chip. Further, at least one spacer element may reside between the top surface of the package element and the bottom surface of the chip. First conductive features extend from the contacts of the chip along the top surface, at least some of said first conductive features potentially extending through the at least one via of the chip.

Another aspect of the invention provides a method for manufacturing an assembly. This method includes bonding at least one spacer element between a top surface of a packaging wafer and a bottom surface of a device wafer including integrated circuit chips. Bonding may preferably be performed so that a top surface of the device wafer having the contacts of the chips faces away from the packaging wafer, and so that the at least one spacer element forms at least one substantially closed cavity between the chip and the packaging wafer. The method further includes severing the wafers around the at least one spacer element.

Another aspect of the invention provides another method for manufacturing an assembly. This method includes bonding at least one spacer element between a top surface of a packaging wafer and a bottom surface of a device wafer including integrated circuit chips. Bonding is usually performed so that a top surface of the device wafer having the contacts of the chips faces away from the packaging wafer, and so that the at least one spacer element forms at least one cavity between the chip and the wafer. Further included is a step of applying first conductive features from the contacts along the top surface of the chip and along at least one edge surface of the chip, and severing the wafers around the at least one spacer element.

DETAILED DESCRIPTION

A chip assembly, including a package element separated from an integrated circuit chip by a spacer element so that contacts of the chip are exposed, may be manufactured according to the following embodiment of the invention.

Figure 1A:
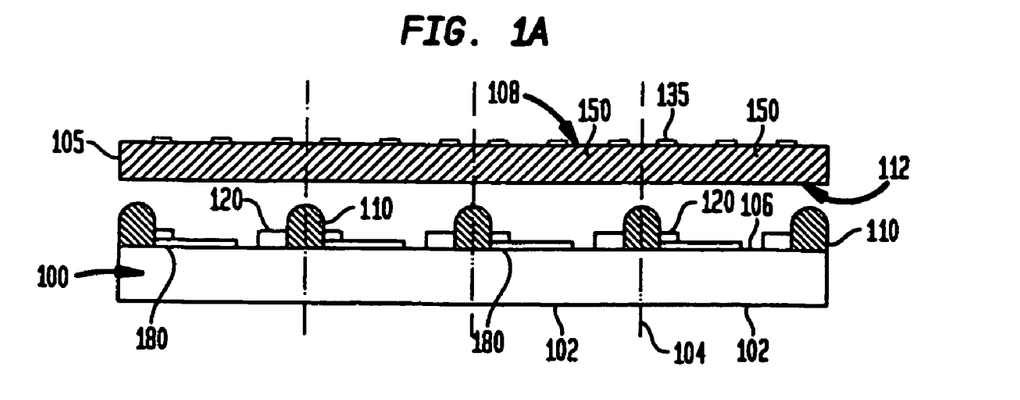
FIGS. 1A, 1B, 1C, 1D, and 1E are simplified illustrations of steps in a method for manufacturing an assembly according to an embodiment of the present invention.

FIG. 1A shows a package wafer 100 which includes a plurality of regions 102. Spacer elements 120 are disposed along boundaries 104 of the regions 102. The boundaries 104 of the regions 102 are represented by broken lines for illustrative purposes; the boundaries typically are not visible in practice. The package wafer has conductive features 180. In the particular embodiment depicted, only one conductive feature is shown in each region 102, but any number of conductive features may be provided in each region. The conductive features 180 of each region 102 extend to one or more of the region boundaries 104. Spacer elements 120 project upwardly from the top surface 106 of the package wafer. The spacer elements 120 may be formed separately from the package wafer 100 and bonded to the top surface, or may be formed integrally with the package wafer 100. An adhesive material 110 is disposed relative to the spacer elements 120. For example, the adhesive material 110 may be placed adjacent to or over the spacer elements 120.

A device wafer 105 is positioned above the package wafer 100. The device wafer 105 may include a plurality of integrated circuit chips 150 having contacts 135 exposed at a top surface 108 of the wafer. The device wafer 105 is positioned so that the top surface 108 of the device wafer faces upwards, away from the package wafer 100, and so that the opposite, bottom surface 112 faces toward the package wafer. The device wafer is positioned so that each chip 150 is aligned with a region 102 of the package wafer 100, and so that the boundaries between chips, commonly referred to as saw lanes, are aligned with the boundaries 104 between the regions 102.

Figure 1B:
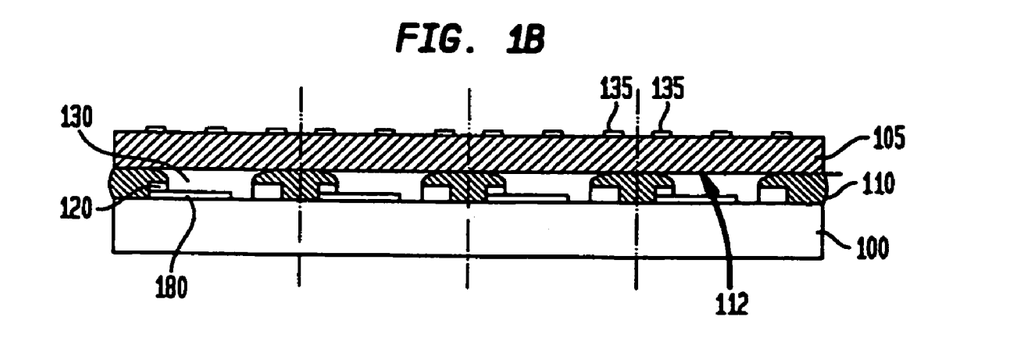

As seen in FIG. 1B, the device wafer 105 may be placed on top of the spacer elements 120 and secured by the adhesive material 110. The spacer elements 120 hold the bottom surface 112 of the device wafer 105 above the package wafer 100, so that the device wafer 105 and package wafer 100 cooperatively define cavities 130 between the device wafer 105 and the package wafer 100. At least some of the conductive features 180 extend into the cavities 130.

Figure 1C:
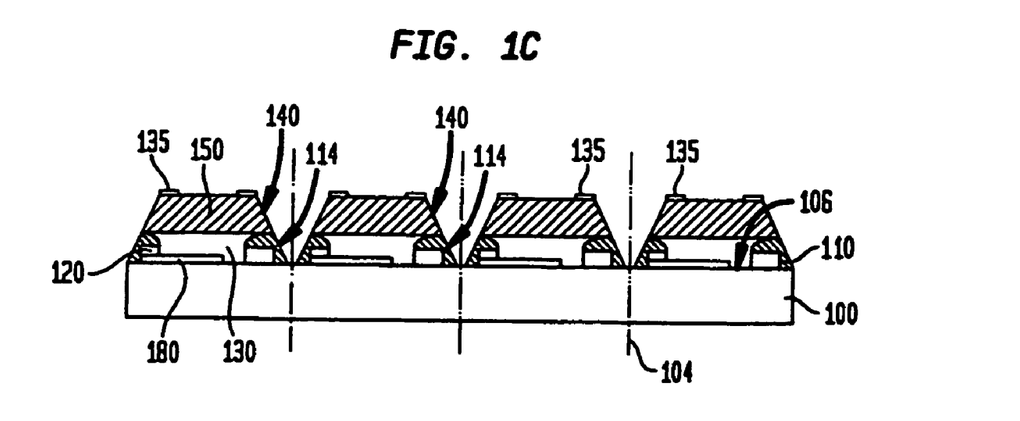

In the next step of the process, the device wafer 105 and the adhesive material 110 are etched, notched, or cut along the boundaries 104 as shown in FIG. 1C. The etching or cutting process servers the device wafer 105 to leave each of the individual integrated circuit chips 150 with edge surfaces 140. The etching or cutting process forms edge surfaces 114 on the adhesive extending downwardly from the edge surfaces of the chips to the top surface 106 of the package wafer 100, and leaves portions of the conductive features 180 at the boundaries 104 exposed. The individual chips 150 remain bonded to the spacer elements 120 and package wafer 100. In a variant, where the spacer elements 120 rather than the adhesive 110 extend across the boundaries 104, the edge surfaces extending downwardly from the chips are formed from the spacer elements instead of the adhesive.

The additional spacers 58 in the above example are rectangular in shape and extend parallel to the trench 52 from one edge of the chip 42 to another. However, any configuration of spacer elements may be used. For example, a plurality of spacers 46, 58 may be placed around the trench. Alternatively, spacers 46 may only reside near edge surfaces or corners of the chip 42 and package element 48. Furthermore, one or more substantially closed cavities 50 may be formed by the spacers 46, 58. For example, the spacer element 46 may be narrow and elongated, similar to that of FIG. 2B, and extend along near the perimeters of the chip 42 and the package element 48. The additional spacer element 58 may be similarly shaped, and extend along near a perimeter of the trench 52. For example, the additional spacer element may form a seal around the trench.

Figure 1D:
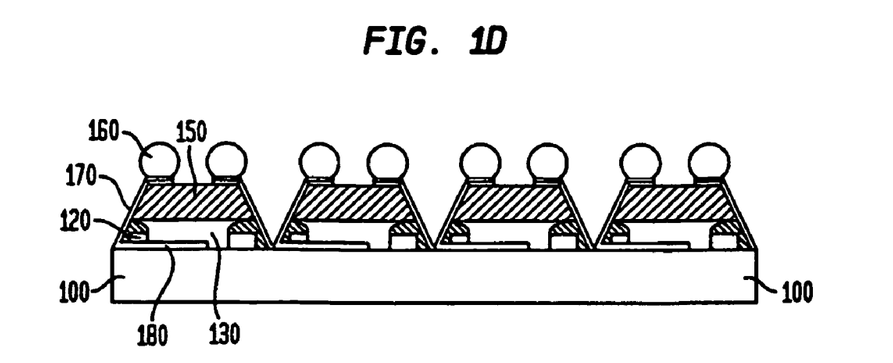

The chip 150 is then furnished with conductive features connected to the contacts 135. As shown in FIG. 1D, first conductive features 170 extend from the contacts 135 along the top surface of the chip 150. At least some of the first conductive features 170 further extend along edge surfaces 140 of the chip 150 and continue along edge surfaces 114 of the adhesive or spacer elements to the top surface of the package wafer 100, where the first conductive features join with the conductive features 180 on the package wafer, also referred to herein as "second" conductive features. The first conductive features 170 may be applied, for example, by deposition of a metallic material using methods such as chemical vapor deposition, electroless plating, sputtering and electroplating, followed by selective etching. Processes as disclosed in U.S. Pat. No. 5,716,759, the disclosure of which is incorporated by reference herein, may be used. Prior to formation of the first conductive features 170, the surfaces of the semiconductor chips may be provided with a dielectric coating (not shown) to insulate the first conductive features from the semiconductor. Interconnect elements 160, such as solder bumps, may be applied to the contacts 135, to the first conductive features 170, or both.

Figure 1E:
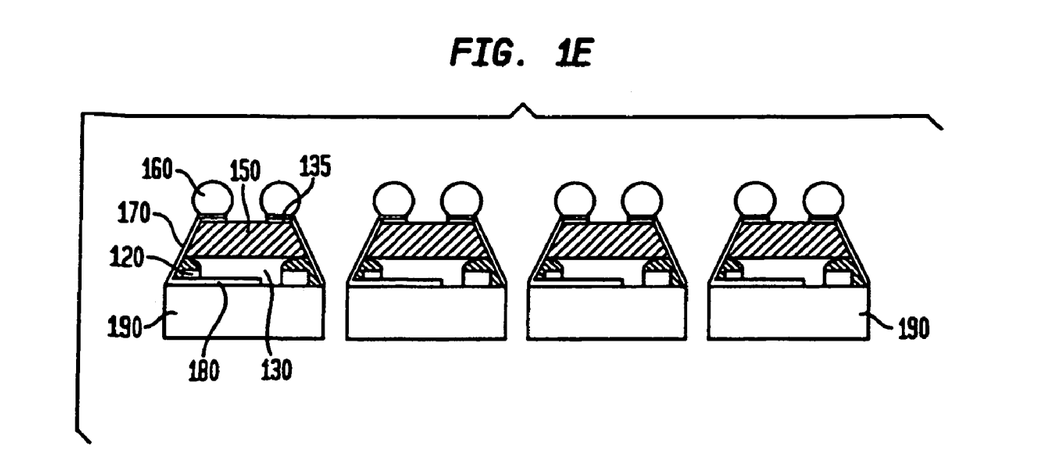

In the next step of the method, the package wafer 100 is severed around the spacer elements 120, along the boundaries between adjacent regions 102 of the package wafer 100. The step of severing the package wafer 100 may be performed, for example, by sawing or etching. As a result, each region 102 of the package wafer 100 forms an individual package element 190 associated with an individual chip 150, and an assembly is formed.

Figure 2A:
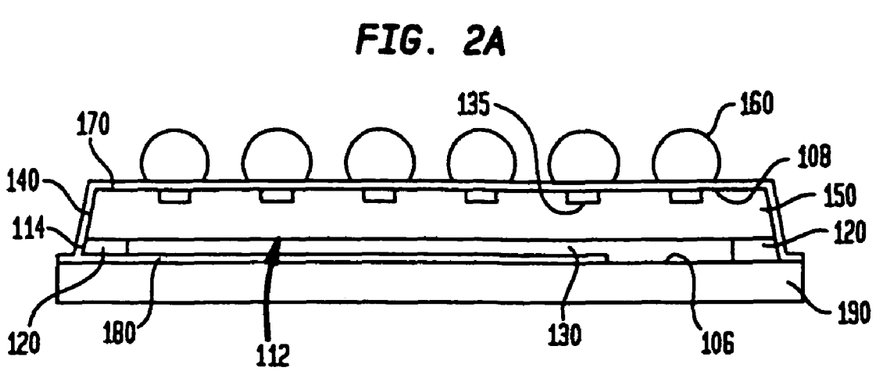
FIG. 2A is a cross-sectional view of an assembly according to an embodiment of the present invention.
Figure 2B:
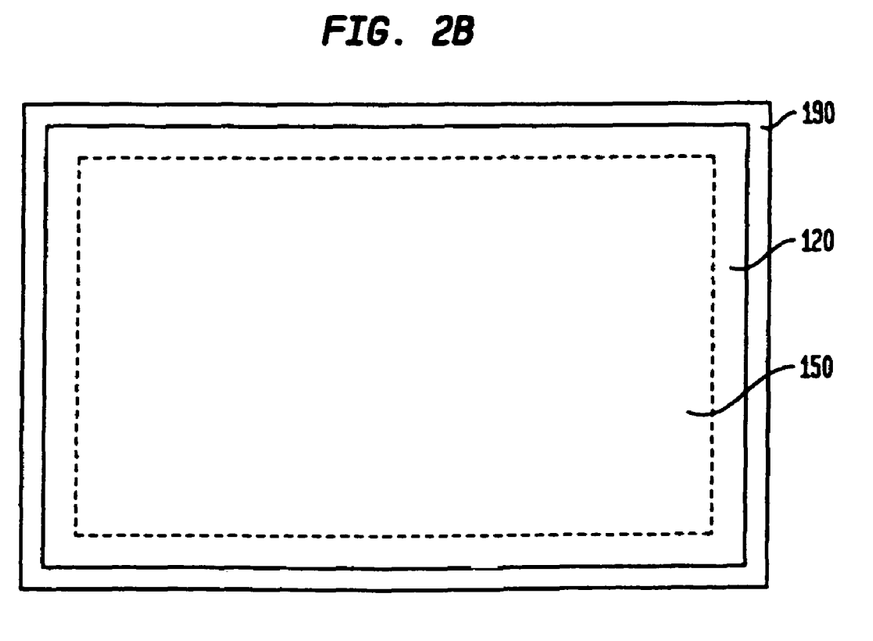
FIG. 2B is a top view of the assembly of FIG. 2A.

FIGS. 2A and 2B show the individual assembly formed by the process of FIGS. 1A-1E. The assembly includes the integrated circuit chip 150 having contacts 135, the chip 150 being spaced from packaging element 190 by spacer element 120. Thus, cavity 130 exists between the chip 150, the packaging element 190, and the spacer 120. Spacer 120, and the associated adhesive, form a seal around cavity 130.

The chip 150 has a top surface 108 with contacts 135, a bottom surface 112, and edge surfaces 140 extending between the top and bottom surfaces. The top surface and the contacts 135 face away from the package element 190. That is, the bottom surface 112 of the chip 150 is bonded to the spacer element 120, which is further bonded to the package element 190.

The spacer 120 is positioned near the outer edges of the chip 150 and the package element 190. FIG. 2B better shows a shape of the spacer 120 according to this embodiment. Specifically, the spacer 120 is a narrow elongated strip of material in the form of the perimeter of a rectangle. The spacer 120 thus defines a substantially closed cavity 130.

As shown in FIG. 2A, the first conductive features 170 extend from the contacts 135 along a top surface of the chip 150, along an edge surface, along the surface 114 defined by the spacer element 120, the adhesive, or both, and further along a top surface of the package element 190. The second conductive features 180, connected to the first conductive features 170, extend along the top surface of the package element 190 into the cavity 130. Merely by way of example, the second conductive features 180 may define an antenna. This arrangement is particularly useful where the chip is a radio frequency transmitter, receiver, or transceiver. In this case, the assembly provides a surface-mountable unit which includes the antenna, and the antenna is spaced apart from the chip. Alternatively, the second conductive features 180 may define an inductor, a resistor, a capacitor, or any other circuit component.

The package element 190 may be any of a variety of materials. For example, it may include glass, silicon, crystal, germanium, etc. Desirably, the material of the package element has a coefficient of thermal expansion (CTE) close to the CTE of the chip 150. The first conductive features 170 may be, for example, metal, conductive polymer, or other electrically conductive material. The second conductive features 180 may be of the same or similar material as the first conductive features 170.

The package element 190 may be a passive element, and may include features such as further conductors (not shown) extending from conductors 180 through the package element to terminals (not shown) on the bottom surface of the package element, facing away from chip 150. Alternatively, the package element 190 may include active semiconductor devices, passive electrical components such as resistors, capacitors and inductors, or both. In still other embodiments, the package element 190 may include components which can function as a surface acoustic wave (SAW) device or a microelectromechanical system (MEMS). These components typically are disposed at the front surface 106 of the package wafer prior to assembly of the device wafer with the package wafer, so that these components will be disposed within the cavity 130 of each finished unit. These additional entities, or components thereof, may be electrically connected to the second conductive features 180.

In a variant of the method discussed above, severance of the package wafer 100 may be performed at approximately the same time that the device wafer 105 and adhesive 110 are etched. Alternatively, the package wafer 100 may be severed prior to severance of the device wafer 105. Accordingly, disposition of the first and second conductive features 170, 180 may in some instances occur subsequent to the severance of the package wafer 100.

Although the spacer elements are depicted in FIG. 1A as separate spacer elements associated with the various regions of the package wafer, the spacer elements for all of the regions may be provided as a unitary frame, with spacer elements connected to one another by temporary connections (not shown) which extend across the boundaries 104 between the regions. These temporary connections are severed when the package wafer is severed.

A variant of the above described method includes bonding at least one spacer element 120 between the package wafer 100 and one or more individual integrated circuit chips 150. In this variant, each chip 150 is positioned over the spacer elements 120 so that its top surface faces away from the packaging wafer 100. In this instance, the step of etching the chip 150 and adhesive 110 may be omitted.

Although the first conductive features 170 in the above described example were applied to extend from the contacts 135 on the top surface of the chip 150 to the top surface of the package element 190, the first conductive features 170 may be applied in various formats. For example, the first conductive features 170 may merely extend from the contacts 135 along the top surface of the chip 150. Alternatively, they may extend along one or more edge surfaces of the chip 150 without reaching the top surface of the package element 190. It should also be understood that the second conductive features 180 may be applied in varying formats. For example, rather than extending into the cavity 130 along the top surface of the package element 190, the second conductive features 180 may extend along an edge surface of the package element 190. They may further extend along a bottom surface of the package element to provide terminals exposed at the bottom surface. According to another example, the second conductive features 180 may extend through the package element 190.

Figure 3A:
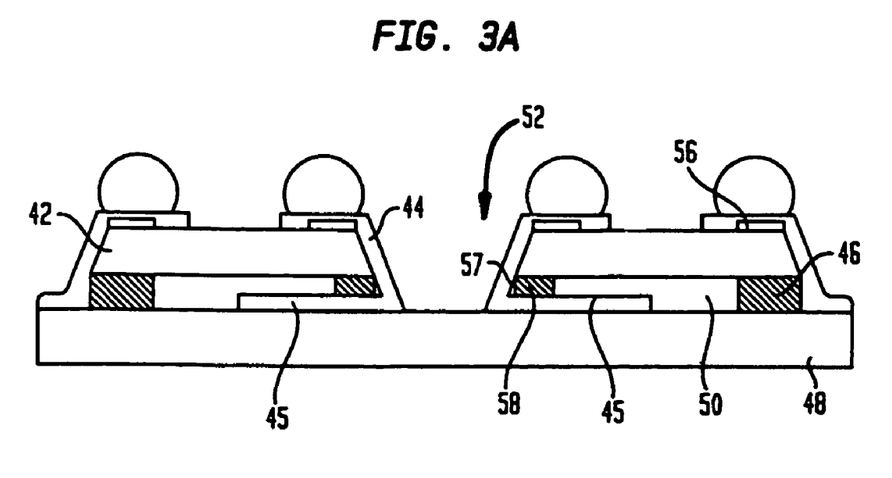
FIG. 3A is a cross-sectional view of an assembly according to another embodiment of the present invention.
Figure 3B:
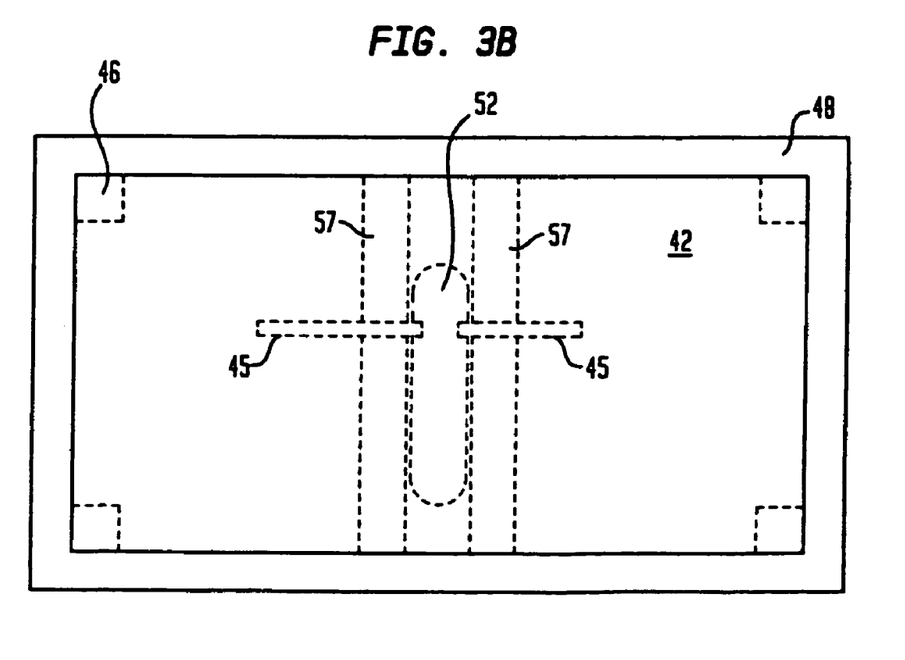
FIG. 3B is a top view of the assembly of FIG. 3A.

FIGS. 3A and 3B show an assembly according to another embodiment of the invention. This assembly includes similar components to the assembly described above with respect to FIGS. 2A and 2B. Specifically, a cavity 50 is defined by spacer elements 46 positioned between integrated circuit chip 42 and package element 48. The integrated circuit chip 42 is positioned so that a top surface having contacts 56 faces away from the packaging element 48. A first conductive feature 44 may extend from the contacts 56 along the top surface and edge surfaces of the chip 42. However, the chip 42 of this embodiment includes a trench 52. The trench 52 resides near a center portion of the chip 42, remote from the edge surfaces. As shown, the trench 52 is roughly elliptical. Additional spacer elements 58 are disposed near the trench 52. Trench 52 may be formed by etching or mechanically cutting through the device wafer at the center of each chip before or after positioning the device wafer on the packaging wafer. Optionally, the additional spacer elements 58 are disposed so that they extend beneath the area of each chip which is removed to form the trench. In this case, the process of etching or cutting the device wafer may be performed so as to form an opening in the spacer element associated with each chip in alignment with the trench of that chip, such opening extending downwardly to the top surface of the packaging wafer. Some of the first conductive features 44 extend along a surface of the trench 52 and along vertically extensive surfaces 57 of the additional spacer elements 58 to the top surface of the package element 48.

Although the trench 52 is preferably remote from edge surfaces of the chip 42, it should be understood that the trench 52 may be positioned anywhere. Furthermore, the trench 52 may be any size or shape, such as rectangular, circular, triangular, or irregularly shaped. The trench 52 is typically formed by etching the chip 42. However, the trench 52 may potentially be formed in the chip 42 during manufacture thereof.

The additional spacers 58 in the above example are rectangular in shape and extend parallel to the trench 52 from one edge of the chip 42 to another. However, any configuration of spacer elements may be used. For example, a plurality of spacers 46, 58 may be placed around the trench. Alternatively, spacers 48 may only reside near edge surfaces or corners of the chip 42 and package element 48. Furthermore, one or more substantially closed cavities 50 may be formed by the spacers 46, 58. For example, the spacer element 46 may be narrow and elongated, similar to that of FIG. 2B, and extend along near the perimeters of the chip 42 and the package element 48. The additional spacer element 58 may be similarly shaped, and extend along near a perimeter of the trench 52. For example, the additional spacer element may form a seal around the trench.

Further to the above example, the first conductive features 44 which extend along the surface of the trench 52 may connect to the second conductive features 45 extending along the top surface of the package element 48 into the cavity 50.

Figure 5:
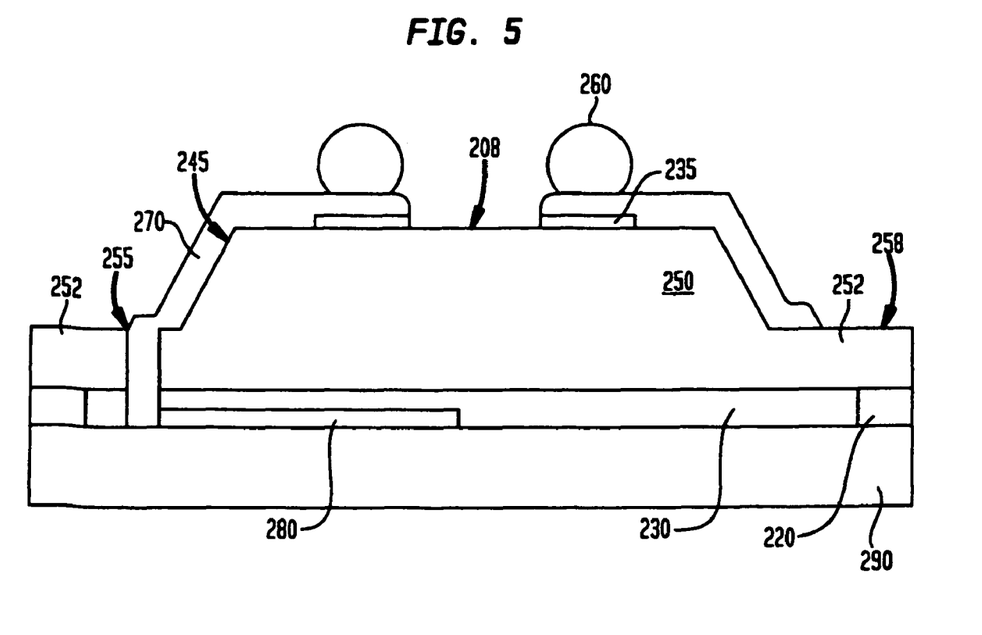
FIG. 5 is a cross-sectional view of an assembly according to another embodiment of the present invention.

FIG. 5 illustrates a chip assembly according to an even further embodiment of the invention. In this embodiment, chip 250 is supported above package element 290 by spacer elements 220, thereby creating a cavity 230 between a top surface of the package element 290 and a bottom surface of the chip 250. The chip 250 may include a top surface 208 and a lowered top surface 258. The chip 250 may also include a via 255 extending through portions 252 of the chip, between the lowered top surface 258 and the bottom surface.

Contacts 235 of the chip 250 are exposed at the top surface 208. First conductive features 270 are connected to the contacts 235, and interconnect elements 260, such as solder bumps, may be applied to the contacts 235, to the first conductive features 270, or both. The first conductive features 270 may extend along the top surface 208 and along an edge surface 245 between the top surface 208 and the lowered top surface 258. The first conductive features 270 may further extend along the lowered top surface 258 and through the conductive via 255. Second conductive features 280 may reside in the cavity 230 and may optionally be electrically connected to the first conductive features 270.

According to a variant of the above-described embodiment, the chip 250 may not include lowered top surface 258. For example, the via 255 may extend from the top surface 208 through the chip 250 to the bottom surface. Accordingly, the first conductive features 270 may extend along the top surface 208 and through the via 255, as opposed to extending along a side edge.

Figure 4A:
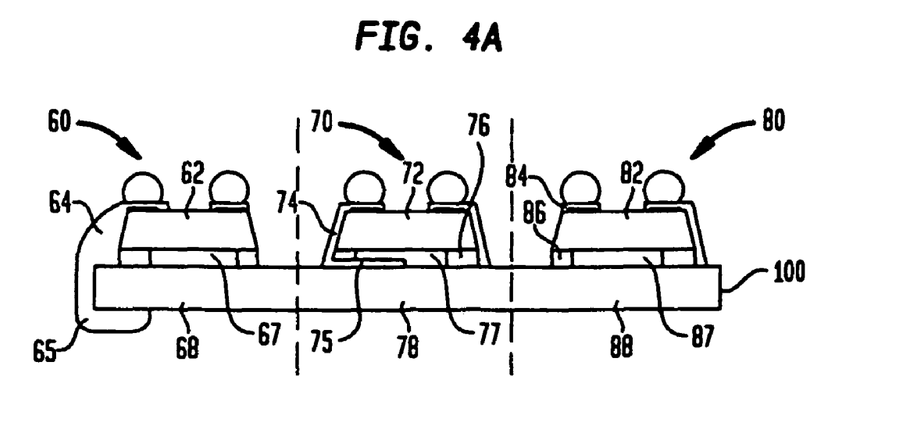
FIG. 4A is a cross-sectional view of a plurality of assemblies according to varying embodiments of the present invention.
Figure 4B:
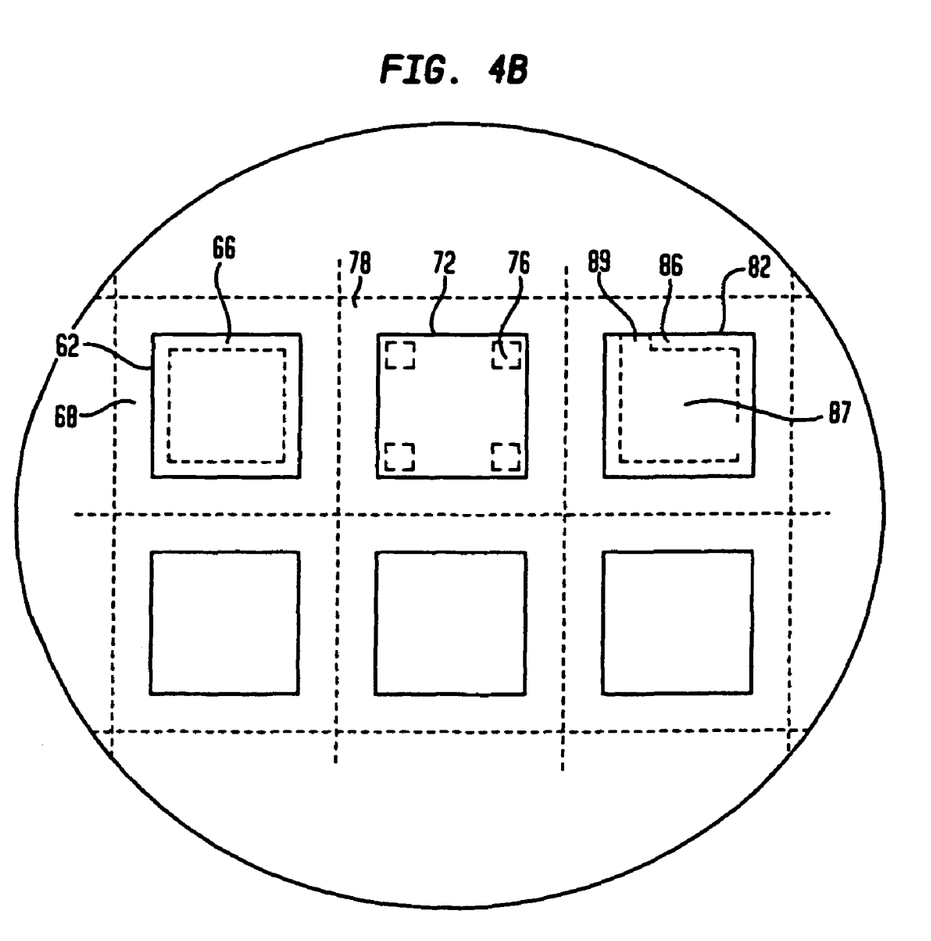
FIG. 4B is a top view of the plurality of assemblies of FIG. 4A.

FIGS. 4A and 4B illustrate a stage of manufacture prior to severing the packaging wafer 100. As shown, wafer 100 has a number of sections including sections 68, 78, and 88. Although these sections are designated by dotted lines, it should be understood that these line are for illustrative purposes, i.e., the sections of the wafer 100 may not be predefined. Several different embodiments 60, 70, and 80 of assemblies and their manufacture are also represented in FIGS. 4A and 4B. Although assemblies may be so manufactured in practice, it is more likely that the assemblies manufactured from one device wafer and one package wafer would be uniform in design. Moreover, it should be understood that the embodiments 60, 70, and 80 represented in FIGS. 4A and 4B do not include every possible variation.

The embodiment 60 includes integrated circuit chip 62, spacer element 66, and wafer section 68. As seen in FIG. 4B, the spacer element 66 forms a completely enclosed cavity. Conductive features 64 are also applied, extending from the contacts along the top surface of the chip 62, and further along the edge surfaces of the chip and the wafer section 68, and along the bottom surface of the wafer section 68. The conductive features in this embodiment thus provide terminals exposed at the bottom surface of the packaging element.

The embodiment 70 includes chip 72, spacers 76, and wafer section 78. FIG. 4B more clearly illustrates that the spacers 76 are four smaller rectangular entities positioned near the corners of the chip 72 and the wafer section 78. First conductive features 74 extend from the contacts along the top surface and edge surfaces of the chip 72, and extend along the small rectangular spacers 76 to the top surface of the packaging element. Second conductive features 75, electrically connected to first conductive features 74, extend along a top surface of the packaging element 78 into cavity 77.

The embodiment 80 includes chip 82, spacer 86, and packaging element 88. Cavity 87 defined by the spacer 86, bottom surface of the chip 82 and top surface of the wafer section 88, is substantially closed. However, as best seen in FIG. 4B, spacer 86 has a gap 89 which forms a vent communicating with cavity 87. First conductive features 84 extend from the contacts on the chip 82 along a top surface of the chip 82. Some of the first conductive features further extend along edge surfaces of the chip 82 and onto the top surface of the wafer section 88. In a further variant, the spacer 86 may include an additional section which serves as a baffle to prevent entry of particles into the chamber.

Although the invention herein has been described with reference to particular embodiments, it is to be understood that these embodiments are merely illustrative of the principles and applications of the invention. It is therefore to be understood that numerous modifications may be made to the illustrative embodiments and that other arrangements may be devised without departing from the spirit and scope of the invention as defined by the appended claims.

The invention claimed is:

1. An assembly, comprising:
a package element having a top surface;
an integrated circuit chip having a top surface, a bottom surface, and contacts exposed at the top surface, the package element being disposed below the chip with the top surface of the package element facing toward the bottom surface of the chip;
at least one spacer element residing between the top surface of the package element and the bottom surface of the chip, the at least one spacer element forming a substantially closed cavity between the package element and the chip; and
first conductive features extending from the contacts of the chip along the top surface, extending along at least one edge surface of the chip and extending from the at least one edge surface of the chip to the top surface of the package element.

2. The assembly of claim 1, further comprising a bonding material residing on at least some of the first conductive features.

3. The assembly of claim 1, further comprising second conductive features extending along the package element.

4. The assembly of claim 3, wherein the first and second conductive features are electrically connected.

5. The assembly of claim 3, further comprising an antenna disposed within the cavity, the antenna being electrically connected to the second conductive features.

6. The assembly of claim 3, further comprising elements operable to collectively function as a microelectromechanical system disposed within the cavity, at least one of the elements being electrically connected to the second conductive features.

7. The assembly of claim 3, further comprising elements operable to collectively function as a surface acoustic wave device disposed within the cavity, at least one of the elements being electrically connected to the second conductive features.

8. The assembly of claim 1, wherein the package element includes silicon.

9. The assembly of claim 1, wherein the package element includes glass.

10. An assembly, comprising:
a package element having a top surface;
an integrated circuit chip having a top surface, a bottom surface, edge surfaces extending between the top and bottom surfaces and contacts exposed at the top surface, the package element being disposed below the chip with the top surface of the package element facing toward the bottom surface of the chip;
at least one spacer element residing between the top surface of the package element and the bottom surface of the chip, the at least one spacer element forming a cavity between the package element and the integrated circuit chip; and
first conductive features extending from the contacts of the chip along the top surface, at least some of said first conductive features extending along at least one of the edge surfaces of the chip and at least some of the first conductive features extending from the at least one of the edge surfaces of the chip to the top surface of the package element.

11. The assembly of claim 10, wherein the cavity is substantially closed.

12. The assembly of claim 10, further comprising second conductive features extending between the package element and integrated circuit chip into the cavity.

13. The assembly of claim 10, further comprising a bonding material residing on at least some of the first conductive features.

14. The assembly of claim 12, wherein the first conductive features and the second conductive features are connected.

15. The assembly of claim 10, further comprising an antenna disposed within the cavity, the antenna being electrically connected to the second conductive features.

16. The assembly of claim 10, further comprising elements operable to collectively function as a microelectromechanical system disposed within the cavity, at least one of the elements being electrically connected to the second conductive features.

17. The assembly of claim 10, further comprising elements operable to collectively function as a surface acoustic wave device disposed within the cavity, at least one of the elements being electrically connected to the second conductive features.

18. The assembly of claim 10, wherein the package element includes silicon.

19. The assembly of claim 10, wherein the package element includes glass.

* * * * *

UNITED STATES PATENT AND TRADEMARK OFFICE
CERTIFICATE OF CORRECTION

PATENT NO.        : 7,737,513 B2
APPLICATION NO.   : 11/809213
DATED             : June 15, 2010
INVENTOR(S)       : Belgacem Haba, Charles White and Michael J. Nystrom It is certified that error appears in the above-identified patent and that said Letters Patent is hereby corrected as shown below:

Column 3, Line 21, "servers" should read --severs--.
Column 6, Line 18, "48" should read --46--.

Signed and Sealed this
Twenty-first Day of June, 2011

David J. Kappos
*Director of the United States Patent and Trademark Office*